United States Patent [19]
Maki

[11] Patent Number: 5,477,178
[45] Date of Patent: Dec. 19, 1995

[54] DATA-HOLD TIMING ADJUSTMENT CIRCUIT

[75] Inventor: Yasuhiko Maki, Kawasaki, Japan

[73] Assignee: Fujitsu Limited, Kawasaki, Japan

[21] Appl. No.: 213,514

[22] Filed: Mar. 16, 1994

[30] Foreign Application Priority Data

Aug. 20, 1993 [JP] Japan ................... 5-206567

[51] Int. Cl.$^6$ ................................................ H03H 11/26
[52] U.S. Cl. .......................... 327/161; 327/262; 327/270
[58] Field of Search ............................. 327/161–163, 327/199–203, 209–213, 261–264, 270, 271, 276, 277, 141, 144, 291, 293

[56] References Cited

U.S. PATENT DOCUMENTS

| | | | |
|---|---|---|---|
| 4,330,750 | 5/1982 | Mayor ........................................ | 328/55 |
| 4,644,182 | 2/1987 | Kawashima et al. .................... | 307/246 |
| 4,894,791 | 1/1990 | Jiang et al. ............................... | 307/597 |
| 5,063,313 | 11/1991 | Kikuda et al. .......................... | 307/605 |
| 5,097,159 | 3/1992 | Seki et al. ............................... | 307/602 |
| 5,107,153 | 4/1992 | Osaki et al. ............................. | 307/601 |
| 5,130,564 | 7/1992 | Sin ........................................... | 307/246 |
| 5,137,202 | 5/1994 | Waizman ................................. | 307/603 |

Primary Examiner—Timothy P. Callahan
Assistant Examiner—T. Lam
Attorney, Agent, or Firm—Staas & Halsey

[57] ABSTRACT

A data-hold timing adjustment circuit having resistance wires to which a power-supply voltage is supplied, formed along numerous flip-flops. MOS variable capacitors $3i$ and $4i$ ($i=1$ to $n$) are connected at one electrode to the data input end of the flip-flops and at another electrode to the resistance wires. The composite capacitance of the MOS capacitors becomes larger as the value of $i$ increases, independent of the voltage level of the data input end of the flip-flops. When the potential of the data input end of the flip-flop shifts from a high/low level to a low/high level, this shift is delayed more as the value of $i$ becomes larger, while the clock input to the flip-flop is delayed more as the value of $i$ becomes larger.

19 Claims, 7 Drawing Sheets

DATA-HOLD TIMING ADJUSTMENT CIRCUIT

BACKGROUND OF THE INVENTION

1. Field of the Invention

The present invention relates to a data-hold timing adjustment circuit which adjusts the deviations in hold timings of bits of parallel data in flip-flops or latch circuits or the like caused by propagation delays of a clock through a clock line.

2. Description of the Related Art

In a semiconductor integrated circuit such as a DRAM, for example, 256-bit parallel data are written in synchronization with a clock in one line of 256×256 memory cells which is specified with a column address, and each line is considered to be a 256-bit register. In a register with a great number of bits such as this, the timing with which parallel data are held in the register in synchronization with the clock becomes problematic, as described below, at higher operating speeds.

Figure 7A:
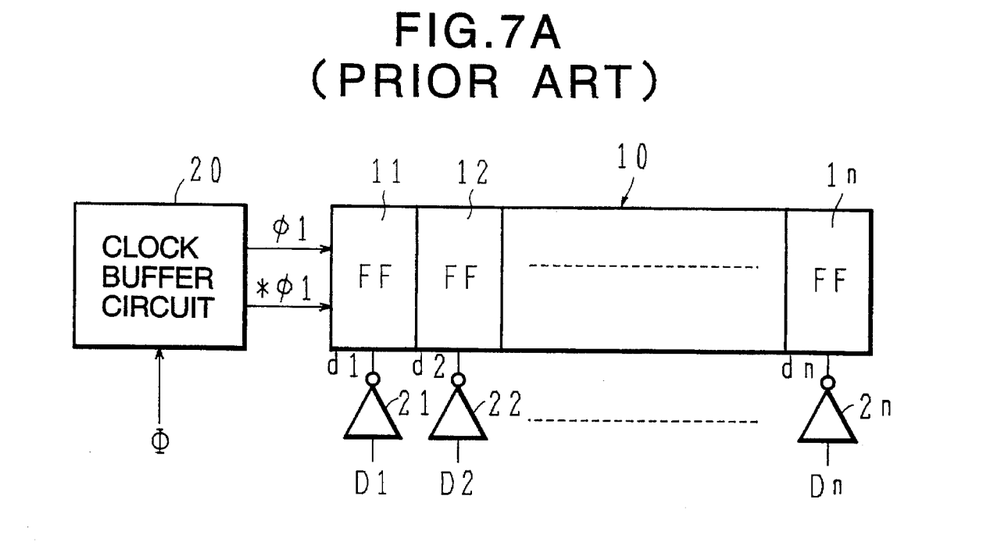
FIG. 7A is a prior art data-hold circuit diagram and FIG. 7B and 7C are timing charts showing the operation of the circuit in FIG. 7A.

In FIG. 7A, the register 10 consists of n number of D flip-flops 11 to 1n, and each D flip-flop is provided with a data input end and a pair of clock input ends. Each D flip-flop holds data supplied to the data input end in synchronization with one pair of complementary clocks φ 1 and * φ 1 which are supplied to the clock input ends. The clocks φ 1 and * φ 1 are generated from the clock φ via a clock buffer circuit 20. The output ends of the inverters 21 to 2n are connected to the data input ends of the D flip-flops 11 to 1n respectively and the n-bit parallel data D1 to Dn are supplied to the D flip-flops 11 to 1n via the inverters 21 to 2n.

Figure 7B:
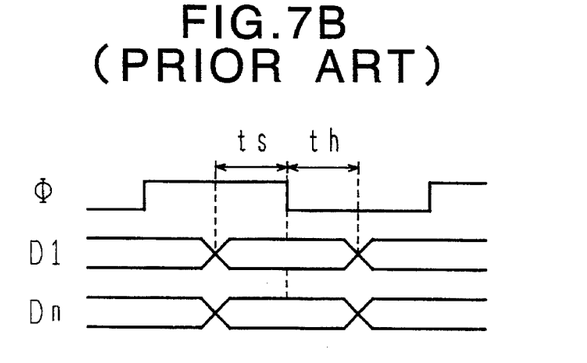
Figure 7C:
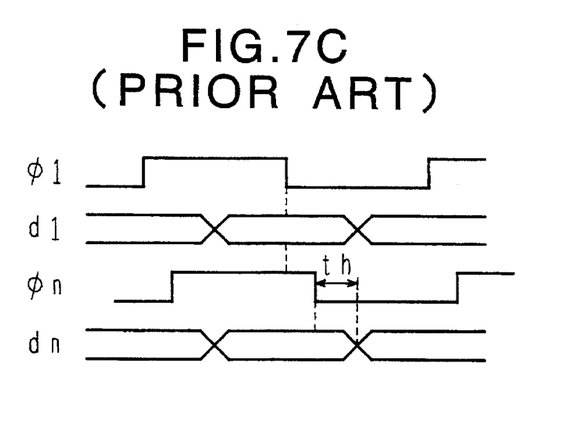

The relationship between the clock φ and the data D1 and Dn is illustrated in FIG. 7B. The set-up time ts and the hold time th are both set at, for example, 1ns. The relationship between the clock φ 1 supplied to the clock input end of the D flip-flop 11 and the data d1 supplied to the data input end of that is illustrated in FIG. 7C and it is identical to the relationship shown in FIG. 7B.

However, since the pairs of clock input ends in each of the D flip-flops 11 to in are commonly connected via the clock input line, the clock is propagated with different delays through this clock input line to the clock input ends of the D flip-flops 11 to 1n. Because of this, the relationship between the clock φ n that is supplied to the clock input end of the D flip-flop 1n, which is the farthest from the clock buffer circuit 20, and the data dn that is supplied to the data input end of the D flip-flop 1n, is as shown in FIG. 7C; that is, the margin of the hold time th is reduced as the data-hold timing deviates and if the clock frequency is increased to facilitate high speed operation, this will cause errors or restriction of high speed operation.

In the prior art, in order to adjust this deviation in the data-hold timing, multi-stage inverters are connected to its data input ends such that the number of stages is larger as the clock delay is longer.

However, since it is necessary to change the stages of inverters to be connected depending upon the number of bits n of the register 10, the structure must be altered according to the number of bits. Also, the layout area required for the inverters is considerable and, since the area for for all the inverters is secured in a rectangle, the fewer the stages of inverters, the higher the ratio of dead space.

SUMMARY OF THE INVENTION

Accordingly, an object of the present invention is to provide a data-hold timing adjustment circuit which can have a same structure regardless of the number of latch means, for example flip-flops, and in which the layout area can be reduced.

According to the present invention, there is provided a data-hold timing adjustment circuit for a plurality of latch means each having a clock input end and a data input end and holding a data supplied to the data input end in synchronization with a clock supplied to the clock input end, the clock input ends of all the latch means being commonly connected via a clock input line, the data-hold timing adjustment circuit comprising: a plurality of variable capacitors each having a first electrode connected to the data input end and a second electrode, capacitance of the capacitor being variable according to voltage applied between the electrodes; and a resistance wire supplied a DC voltage between two points, a point between the two points being conducted to the second electrode of the variable capacitor so that the capacitance delays the data to the data input end of the flip-flop in accordance with a propagation delay of the clock to the clock input end of the flip-flop.

The deviation in data-hold timing caused by the clock being delay propagated through the clock input line can be adjusted by applying a divided voltage on the resistance wire to the second electrodes of the variable capacitors to set the capacitance of the variable capacitors at a suitable value. The data-hold timing adjustment circuit can be structured identically regardless of the number of latch means and the layout area can be reduced since the variable capacitors are identically structured.

In the first aspect of the above-described invention, each of the variable capacitors includes: the first electrode which is one of a p-type and an n-type region on a semiconductor substrate; an insulator on the first electrode; and the second electrode which is on the insulator.

In this first aspect, the capacitance of the variable capacitor changes in dependence on the thickness of the depletion layer in the p-type or n-type region. The thicker the depletion layer, the smaller the capacitance.

In the first form of the above-described first aspect of the invention, the resistance wire are formed by connecting the second electrodes in series.

By this first form, the structure can be more simple.

In the second form of the above-described first aspect of the invention, the resistance wire is connected at its one end to a first power-supply voltage line supplied a voltage of approximately equal to high voltage level of binary and at its another end to a second power-supply voltage line supplied a voltage of approximately equal to low voltage level of binary.

In the third form of the above-described first aspect of the invention, at least one end portion of the resistance wire intersects at its different points with the first or second power-supply voltage line and its branch line via an insulator and the resistance wire is connected to the power-supply voltage line or the branch line via a contact hole formed in the insulator at its intersecting point.

With this third form, by selecting the intersection point to connect the resistance wire and the power-supply voltage line, the adjustment of the deviation of the data-hold timing can be performed more properly.

In the second aspect of the above-described invention, each of the variable capacitors includes: the first electrode having n-type well on a semiconductor substrate, p-type region on the n-type well and a interconnection between the n-type well and the p-type region; an insulator on the n-type well and on the p-type region; and the second electrode having a first gate being opposite to the n-type well via the insulator and a second gate being opposite to the p-type region via the insulator.

In the third aspect of the above-described invention, each of the variable capacitors includes: the first electrode having p-type well on a semiconductor substrate, n-type region on the p-type well and a interconnection between the p-type well and the n-type region; an insulator on the p-type well and on the n-type region; and the second electrode having a first gate being opposite to the p-type well via the insulator and a second gate being opposite to the n-type region via the insulator.

In this second or third aspect, the capacitance of the variable capacitor changes in dependence on the thickness of the depletion layer in the p-type or n-type region. The thicker the depletion layer, the smaller the capacitance. The composite capacitance of a pair of the capacitors don't so depend on transition direction, low to high or high to low.

In the first form of the above-described one of the second and third aspect of the invention, a pair of the resistance wires are formed by connecting the first gates in series as a first gate line and the second gates in series as a second gate line.

By this first form, the structure can be more simple.

In the second form of the above-described one of the second and third aspect of the invention, the first gate line is connected at its one end to a first power-supply voltage line supplied a voltage of approximately equal to high voltage level of binary and at its another end to a second power-supply voltage line supplied a voltage of approximately equal to low voltage level of binary; and the second gate line is connected at its one end to the first power-supply voltage line and at its another end to the second power-supply voltage line.

In the third form of the above-described one of the second and third aspect of the invention, at least one end portion of the first and second gate lines intersects at its different points with the first or second power-supply voltage line and its branch line via an insulator and the gate line is connected to the power-supply voltage line or the branch line via a contact hole formed in the insulator at its intersecting point.

With this third form, by selecting the intersection point to connect the resistance wire and the power-supply voltage line, the adjustment of the deviation of the data-hold timing can be performed more properly.

In the forth aspect of the above-described invention, the variable capacitors are diodes, capacitance of which being variable according to applied reverse voltage.

In the sixth aspect of the above-described invention, there is provided a semiconductor integrated circuit comprising: a register having a plurality of latch means, each of the latch means having a clock input end and a data input end and holding a data supplied to the data input end in synchronization with a clock supplied to the clock input end, the clock input ends of all the latch means being commonly connected via a clock input line; and anyone of the data-hold timing adjustment circuit described above.

DESCRIPTION OF THE PREFERRED EMBODIMENT

First Embodiment

Figure 1:
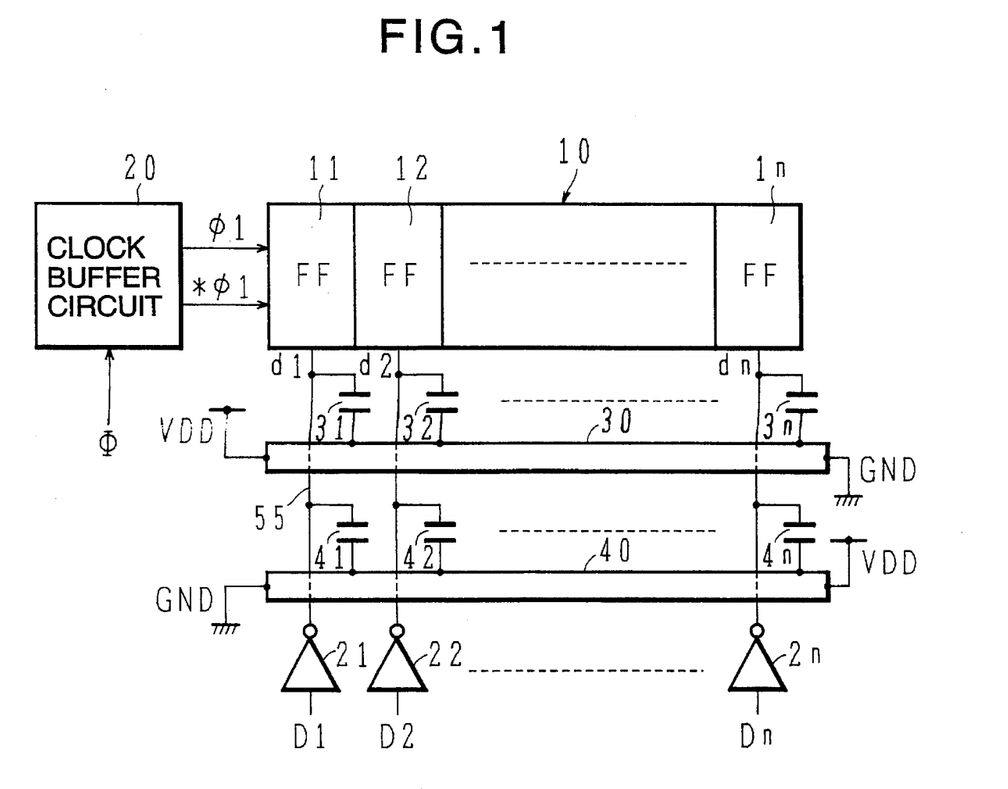
FIG. 1 is a diagram of a data-hold circuit which adopts the data-hold timing adjustment circuit in the first embodiment of the present invention.

FIG. 1 shows a data-hold circuit in the first embodiment. The same reference characters are assigned to identical components to those shown in FIG. 7A an explanation of those components is omitted.

This data-hold circuit is part of a semiconductor integrated circuit and having a register 10 with a large number of bits, for example, 256 bits, which consists of D flip-flops 11 to 1n. Each D flip-flop holds the data supplied to the data input end in synchronization with the complementary clocks supplied to a pair of clock input ends. In regard to each of the pair of clock input ends of the D flip-flops 11 to 1n, they are commonly connected via the clock input line and the clock is delayed while being propagated through this clock input line. The leading end of the clock input line is the clock input end of the D flip-flop 11 and its trailing end is the clock input end of the D flip-flop 1n and the propagation delay becomes larger as going to the right in FIG. 1.

Figure 4A:
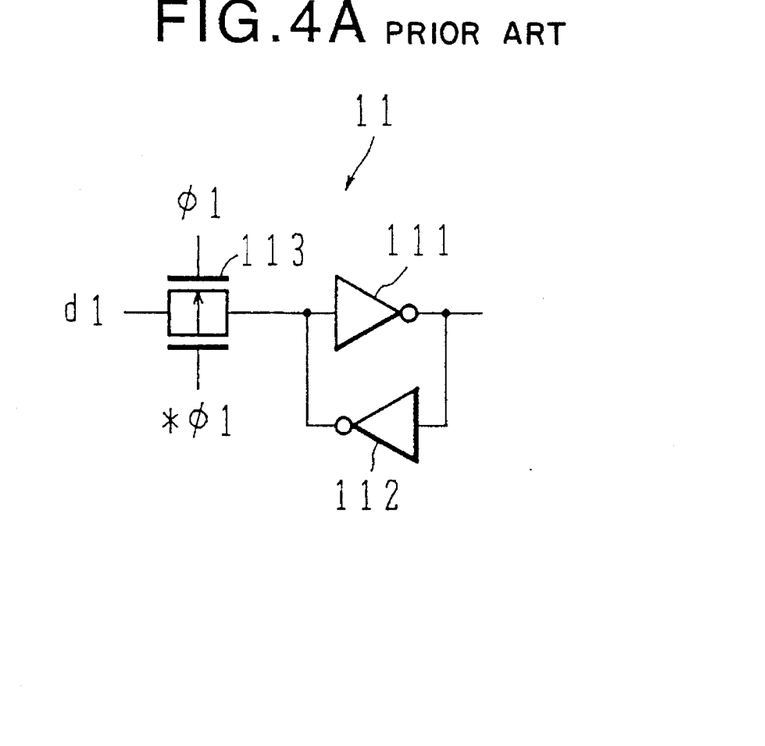
FIGS. 4A and 4B are logic circuit diagrams of the flip-flop in FIG. 1.

The D flip-flops 11 to 1n have an identical structure to each other. FIG. 4A shows an example structure of the D flip-flop 11.

The D flip-flop 11 consists of the data-hold section wherein the output end of the inverter 111 is connected to the input end of the inverter 112 and the output end of the inverter 112 is connected to the input end of the inverter 111, and the transfer gate 113 that is connected to its input side. The transfer gate 113 is constituted by connecting a pMOS transistor and an nMOS transistor in parallel. The clock * φ 1 and φ 1 are supplied to the gates of the pMOS transistor and nMOS transistor, respectively.

When the clock φ 1 is high voltage level and the clock * φ 1 is low voltage level, the transfer gate 113 is ON and the data d1 pass the transfer gate 113 and are held in the data-hold section.

Figure 4B:
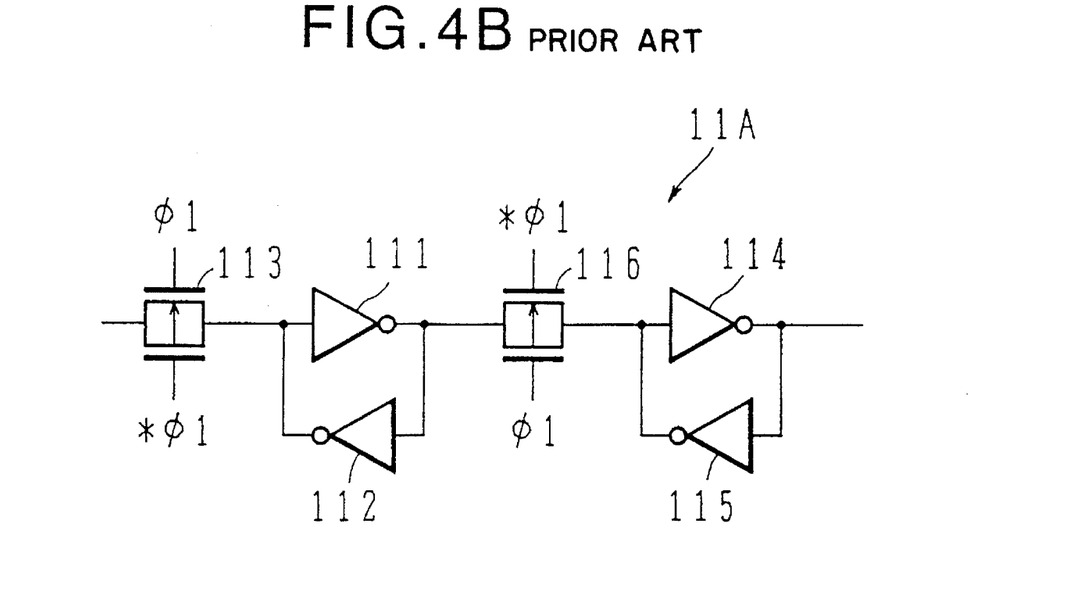

FIG. 4B shows a variation of the D flip-flop. This D flip-flop 11A is a master/slave type D flip-flop in which two D flip-flops 11 are connected in cascade. The inverters 114, 115 and the transfer gate 116 on the following stage have identical structures to the inverters 111, 112 and the transfer gate 113 on the preceding stage, respectively.

As shown in FIG. 1, along the direction of the array of the D flip-flops 11 to 1n, the resistance wires 30 and 40 are formed parallel to each other. The end of the resistance wire 30 on the D flip-flop 11 side and the other end on the D flip-flop In side are connected to the power-supply voltage line VDD and the ground line GND respectively, and the end of the resistance wire 40 on the D flip-flop 11 side and the other end on the D flip-flop in side are connected to the ground line GND and the power-supply voltage line VDD respectively. The voltage VDD–GND is, for example, 3 V. The material for the resistance wires 30 and 40 is, for example, polysilicon, tungsten or the like.

The first train of MOS variable capacitors 31 to 3n and the second train of MOS variable capacitors 41 to 4n are positioned in correspondence with the D flip-flops 11 to 1n. One end of the MOS variable capacitor 3i, i=1 to n, is connected to the data input end of the D flip-flop 1i and the other end is connected to the resistance wire 30. Also, one end of the MOS variable capacitors 4i, i=1 to n, is connected to the data input end of the D flip-flops 1i and the other end is connected to the resistance wire 40.

Figure 2:
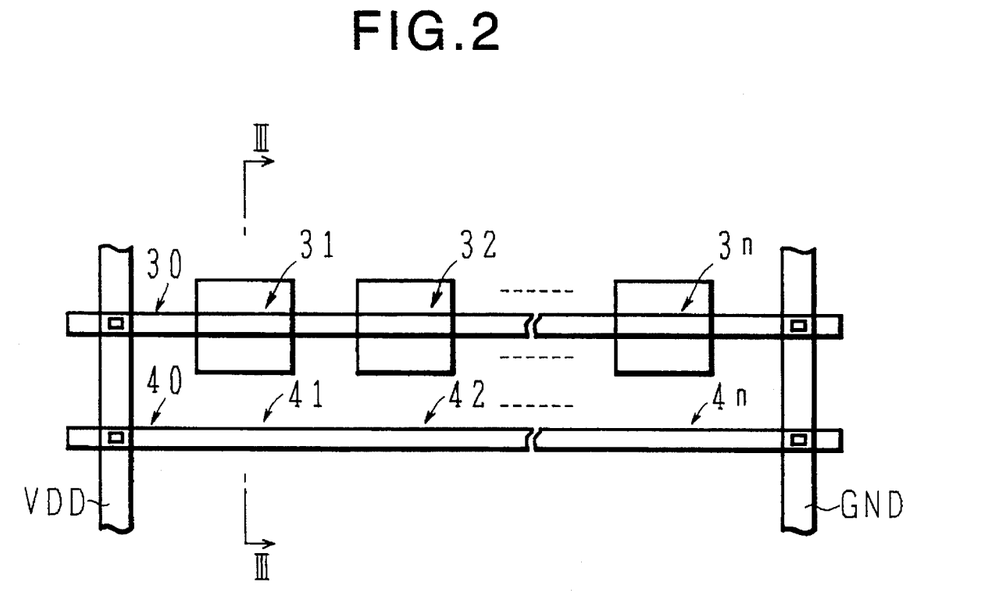
FIG. 2 is a schematic layout pattern diagram of the circuit in FIG. 1.

The fragmentary layout pattern of the resistance wire 30, the power-supply voltage line VDD, the ground line GND and the MOS variable capacitors 31 to 3n and 41 to 4n is shown in FIG. 2.

Figure 3:
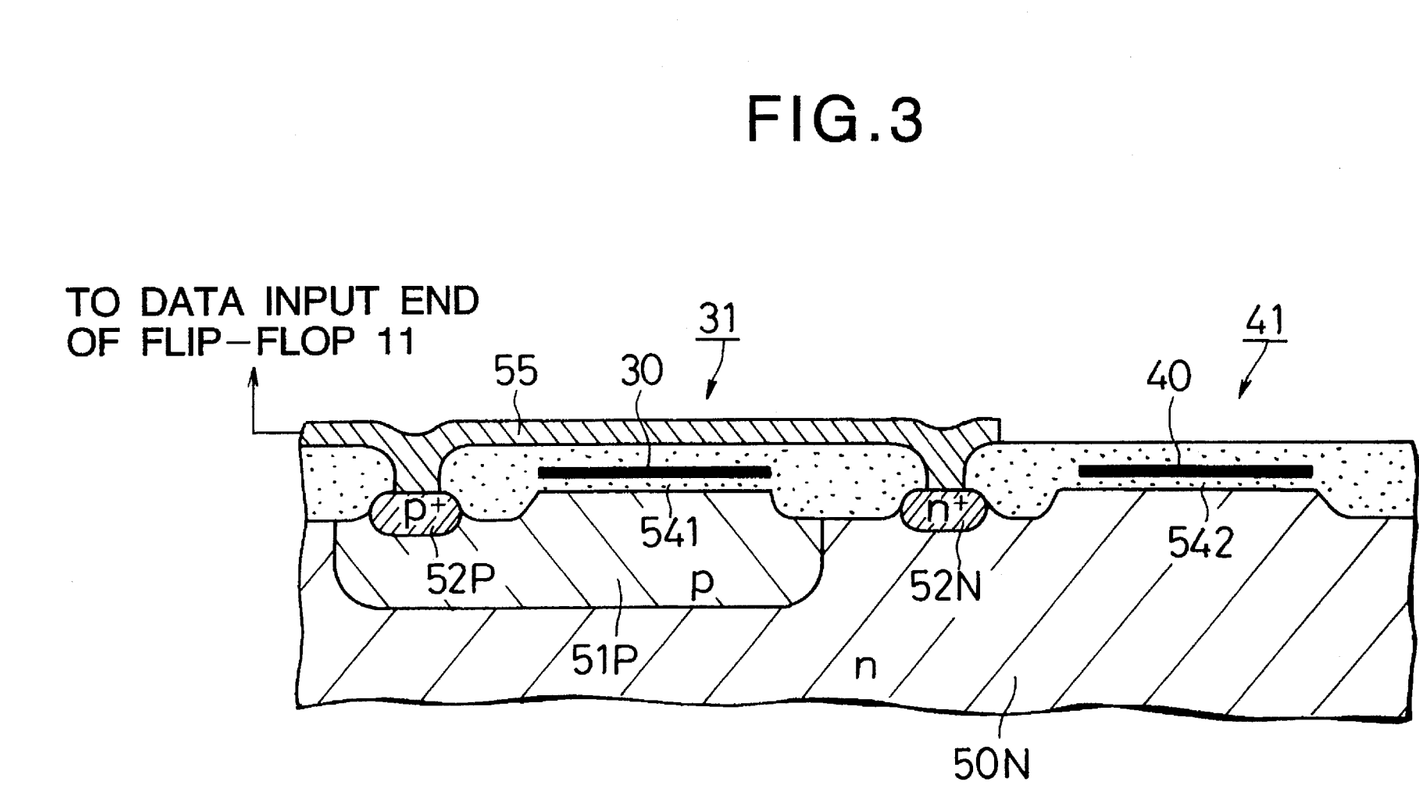
FIG. 3 is an enlarged cross sectional view taken along line III—III in FIG. 2.

The MOS variable capacitors 31 to 3n have structures identical to one another and the MOS variable capacitors 41 to 4n have structures identical to one another. FIG. 3 shows an enlarged cross section taken along line C—C of a pair of MOS variable capacitors 31 and 41 in FIG. 2.

A pair of electrodes that face each other of the MOS variable capacitor 31 are a p-type diffusion region 51P on the n-type well 50N and part of a gate line 30, which is also the resistance wire 30, formed on the p-type diffusion region 51P via the oxide film 541. This gate line 30 includes, as shown in FIG. 2, all the gates of the MOS variable capacitors 32 to 3n. The p-type diffusion region 51P is connected to the metal wire 55 via the p$^+$-type diffusion region 52P. The metal wire 55 is connected to both the data input end of the D flip-flop 11 and the input end of the inverter 21 as shown in FIG. 1.

A pair of electrodes that face to each other of the MOS variable capacitor 41 are the n-type well 50N and part of a gate line 40, which is also the resistance wire 40, formed on the n-type well 50N via the oxide film 542. This gate line includes, as shown in FIG. 2, all the gates of the MOS variable capacitors 42 to 4n. The n-type diffusion region 50N is connected to the metal wire 55 via the n$^+$-type diffusion region 52N.

Next, the operation of the first embodiment structured as described above is explained.

1. When the potential of the data input end of the D flip-flop shifts from low voltage level (approximately 0 V) to high voltage level (approximately VDD);

When the potential of the data input end of the D flip-flop 1i is at low voltage level, in the MOS variable capacitor 3i (i=1 to n), the potential of the p-type diffusion region 51P is lower than the potential of the part of the resistance wire 30 that opposites to the p-type diffusion region 51P. Because of this, a depletion layer is formed in an area of the p-type diffusion region 51P on the side of the resistance wire 30 and the thickness of the depletion layer becomes larger as the voltage between the electrodes of the MOS variable capacitor 3i becomes greater, i.e., as the value of i is smaller. The thicker the depletion layer, the smaller the capacitance of the MOS variable capacitor 3i.

On the other hand, when the potential of the data input end of the D flip-flop 1i is at low voltage level, in the MOS variable capacitor 4i (i=1 to n), the potential of the n-type well 50N is lower than the potential of the part of the resistance wire 40 that opposites to the n-type well 50N. Because of this, no depletion layer is formed in an area of the n-type well 50N on the side of the resistance wire 40 and consequently, the capacitance of the MOS variable capacitor 4i does not depend on the value of i.

As a result, the composite capacitance of the MOS variable capacitors 3i and 4i becomes larger as the value of i increases. Because of this, when the potential of the data input end of the D flip-flop 1i shifts from low voltage level to high voltage level, this shift is delayed more as the value of i becomes larger. At the same time, the clock input to the D flip-flop 1i is delayed more as the value of i becomes larger.

Figure 5:
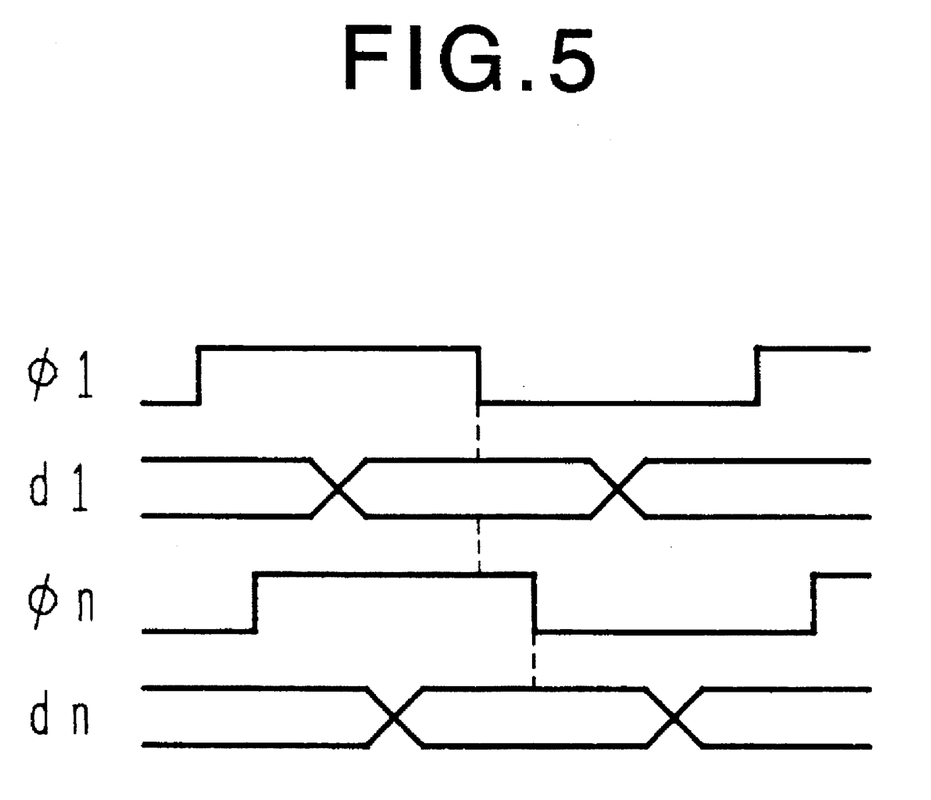
FIG. 5 is a timing chart showing the operation of the circuit in FIG. 1.

Therefore, when the clock φ 1 and the data D1 in relation with the D flip-flop 11 are as shown in FIG. 5, the clock φ n and the data Dn in relation with the D flip-flop in are as shown in FIG. 5. As a result, the deviation in the data-hold timing in each D flip-flop 1i is adjusted and the sufficient margins of the set-up time and hold time are secured.

2. When the potential of the data input end of the D flip-flop shifts from high voltage level to low voltage level;

When the potential of the data input end of the D flip-flop 1i is at high voltage level, in the MOS variable capacitor 4i (i=1 to n), the potential of the n-type well 50N is higher than the potential of the part of the resistance wire 40 that opposites to the n-type well 50N. Because of this, a depletion layer is formed in an area of the n-type well 50N on the side of the resistance wire 40 and the thickness of the depletion layer becomes larger as the voltage between the electrodes of the MOS variable capacitor 4i becomes greater, i.e., as the value of i is smaller. The thicker the depletion layer, the smaller the capacitance of the MOS variable capacitor 4i.

On the other hand, when the potential of the data input end of the D flip-flop 1i is at high voltage level, in the MOS variable capacitor 3i, the potential of the p-type diffusion region 51P is higher than the potential of the part of the resistance wire 30 that opposites to the p-type diffusion region 51P. Because of this, no depletion layer is formed in an area of the p-type diffusion region 51P on the side of the resistance wire 30 and consequently the capacitance of the MOS variable capacitor 3i does not depend on the value of i.

As a result, the composite capacitance of the MOS variable capacitors 3i and 4i becomes larger as the value of i increases. Because of this, when the potential of the data input end of the D flip-flop 1i shifts from high voltage level to low voltage level, this shift is delayed more as the value of i becomes larger. At the same time, the clock input to the D flip-flop 1i is delayed more as the value of i becomes larger.

Consequently, as in the case 1 described above, the deviation in the data-hold timing in each D flip-flop 1i is adjusted and the sufficient margins of the set-up time and hold time are secured.

Second Embodiment

Figure 6A:
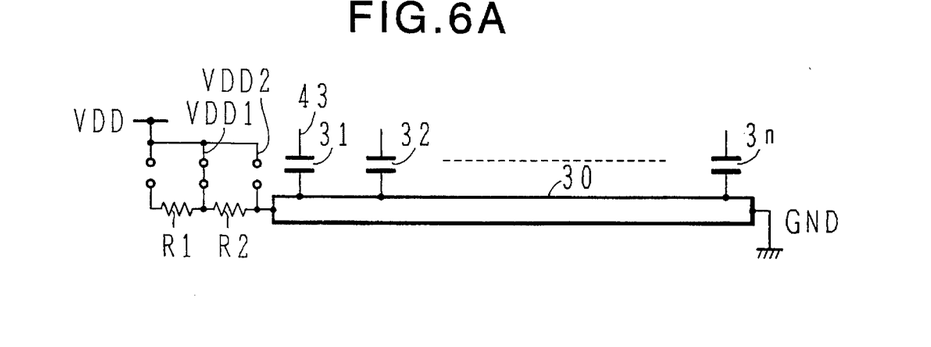
FIG. 6A is a fragmentary circuit diagram of a data-hold timing adjustment circuit in the second embodiment of the present invention.
Figure 6B:
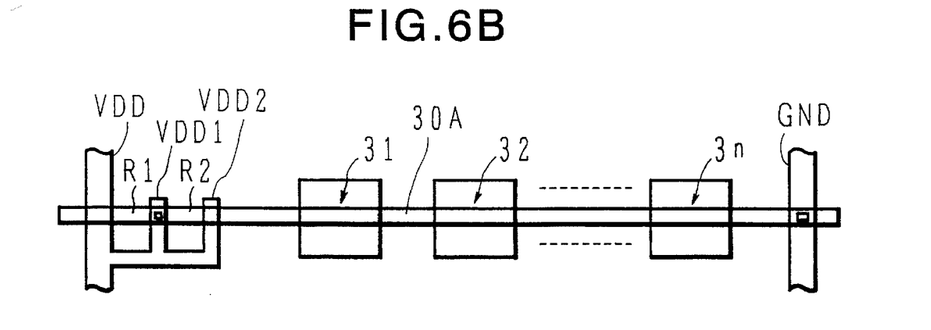
FIG. 6B is a layout pattern diagram for the circuit in FIG. 6A.

The capacitance of the MOS variable capacitors vary depending on the thickness of the depletion layer, or, in other words, depending on the voltage applied to the MOS variable capacitor. Thus, it follows that the data-hold timing can be adjusted by adjusting the supplied voltage. Thus, the data-hold timing adjustment circuit in the second embodiment is structured as shown in FIGS. 6A and 6B. FIG. 6B shows a schematic layout pattern that realizes the circuit shown in FIG. 6A. The same reference characters are assigned to identical components to those shown in FIGS. 1 and 2 and their explanation is omitted here.

For the sake of simplification, in FIGS. 6A to 6D, structures which correspond with the MOS variable capacitors 41 to 4n and the resistance wire 40 in FIG. 1 are not shown.

The resistance wire 30A extends toward the outside from the end of the resistance wire 30 on the side of the MOS variable capacitor 31 and consists of the resistance wire 30 and the adjusting resistance portions R1 and R2 in the extended portion which is continuous with the resistance wire 30. In the extended portion of the resistance wire 30A, it intersects with the power-supply voltage lines VDD1 and VDD2 which branch from the power-supply voltage line VDD and the power-supply voltage line VDD via the insulating film at the upper layer. During the design stage, one of these three intersecting sections is selected; for example, the intersection with the power-supply voltage line VDD1 is selected in FIGS. 6A and 6B and a contact hole is formed in the insulating film in the selected intersection to connect the resistance wire 30A and the power-supply voltage line VDD1. This selection should be made so that the adjustment of the deviation of the data-hold timing by flip-flops can be performed more properly.

Third Embodiment

Figure 6C:
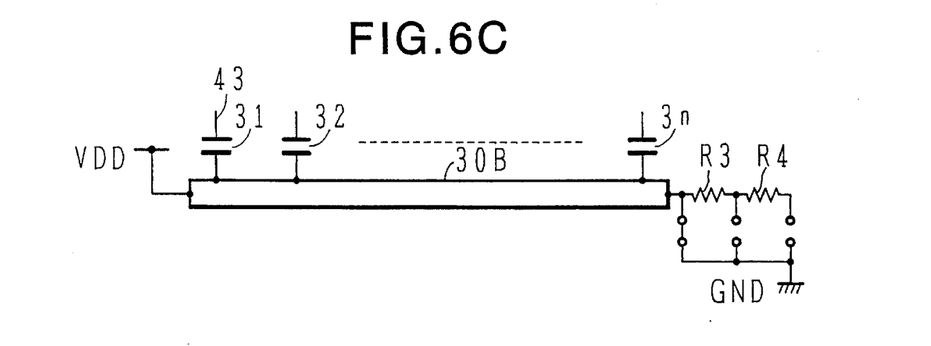
FIG. 6C is a fragmentary circuit diagram of a data-hold timing adjustment circuit in the third embodiment of the present invention and FIG. 6D is a fragmentary circuit diagram of a data-hold timing adjustment circuit in the in the fourth embodiment of the present invention.

FIG. 6C shows the data-hold timing adjustment circuit in the fourth embodiment. The same reference characters are assigned to components identical to those shown in FIG. 6A and their explanation is omitted.

This third embodiment is identical to the second embodiment described above except in that the side that has the extended portion is the opposite of that in the second embodiment.

Fourth Embodiment

Figure 6D:
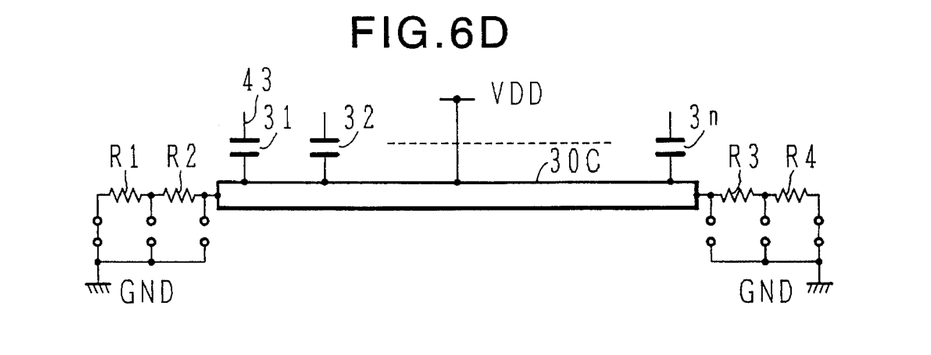

FIG. 6D shows a data-hold timing adjustment circuit in the fourth embodiment. The same reference characters are assigned to components identical to those shown in FIGS. 6A and 6C and their explanation is omitted.

The resistance wire 30C in this fourth embodiment is provided with both the extended portions in the second embodiment and the third embodiment above. Also, a clock is transmitted in both directions with the clock input end of the D flip-flop on the central side of the D flip-flops 11 to 1n shown in FIG. 1 as the leading end, and the point on the resistance wire 30C which corresponds to this leading end is connected to the power-supply voltage line VDD and both ends of the resistance wire C are connected to the ground line GND.

Having described specific embodiments of the present invention, it is to be understood that modification and variation of the invention are possible without departing from the spirit and scope thereof. For example, MIS variable capacitors other than MOS variable capacitors may be used. In FIG.3, the structure which p-type and n-type are swapped each other may be used. A resistance wire or a gate line need not be parallel to an array of flip-flops which may be arranged in a plurality of rows. Further, it may take a structure in which instead of MOS variable capacitors, other variable capacitors, for example, pn junction diodes which capacitance vary in accordance with the thickness of depletion layer may be used.

What is claimed is:

1. A data-hold timing adjustment circuit for a plurality of latch means, each having a clock input end and a data input end, for holding a data supplied to the data input end in synchronization with a clock supplied to the clock input end, the clock input ends of all the latch means being commonly connected via a clock input line, the data-hold timing adjustment circuit comprising:

a plurality of variable capacitors each having a first electrode respectively connected to each of the data input ends and a second electrode, a capacitance of each of said variable capacitors varying according to a voltage applied between said first and second electrodes; and a resistance wire, supplied with said voltage between two points of said resistance wire, further having a plurality of points between said two points each being respectively connected to each of said second electrodes of said variable capacitors so that said capacitance of each of said variable capacitors delays the data to the data input end of each of the plurality of latch means in accordance with a propagation delay of the clock to the clock input end of each of the plurality of latch means.

2. A data-hold timing adjustment circuit according to claim 1, wherein said plurality of latch means include a plurality of flip-flops.

3. A data-hold timing adjustment circuit according to claim 1, wherein each of said variable capacitors includes:

said first electrode which is one of a p-type and an n-type region on a semiconductor substrate;

an insulator on said first electrode; and said second electrode which is on said insulator.

4. A data-hold timing adjustment circuit according to claim 3, wherein said resistance wire is formed by connecting said second electrodes in series.

5. A data-hold timing adjustment circuit according to claim 4, wherein said resistance wire is connected at its one end to a first power-supply voltage line supplied with said voltage approximately equal to a high voltage level of binary form and at its other end to a second power-supply voltage line supplied with said voltage approximately equal to a low voltage level of binary form.

6. A data-hold timing adjustment circuit according to claim 5, wherein at least one end portion of said resistance wire intersects at one of said two points with said first or second power-supply voltage line via an insulator and said resistance wire is connected to said power-supply voltage line via a contact hole formed in said insulator at said intersecting point.

7. A data-hold timing adjustment circuit according to claim 1, wherein each of said variable capacitors includes:

said first electrode having an n-type well on a semiconductor substrate, a p-type region on said n-type well and an interconnection between said n-type well and said p-type region;

an insulator on said n-type well and on said p-type region; and said second electrode having a first gate being opposite to said n-type well via said insulator and a second gate being opposite to said p-type region via said insulator.

8. A data-hold timing adjustment circuit according to claim 7, further including a second resistance wire to provide a pair of resistance wires formed by connecting said first gates in series as a first gate line and said second gates in series as a second gate line.

9. A data-hold timing adjustment circuit according to claim 8, wherein:

said first gate line is connected at its one end to a first power-supply voltage line supplied with said voltage approximately equal to a high voltage level of binary form and at its other end to a second power-supply voltage line supplied with said voltage approximately equal to a low voltage level of binary form; and said second gate line is connected at its one end to said first power-supply voltage line and at its other end to said second power-supply voltage line.

10. A data-hold timing adjustment circuit according to claim 9, wherein at least one end portion of said first and second gate lines intersects at one of said two points with said first or second power-supply voltage line via an insulator and said gate line is connected to said power-supply voltage line via a contact hole formed in said insulator at said intersecting point.

11. A data-hold timing adjustment circuit according to claim 1, wherein each of said variable capacitors includes:

said first electrode having a p-type well on a semiconductor substrate, an n-type region on said p-type well and an interconnection between said p-type well and said n-type region;

an insulator on said p-type well and on said n-type region; and said second electrode having a first gate being opposite to said p-type well via said insulator and a second gate being opposite to said n-type region via said insulator.

12. A data-hold timing adjustment circuit according to claim 11, further including a second resistance wire to provide a pair of resistance wires formed by connecting said first gates in series as a first gate line and said second gates in series as a second gate line.

13. A data-hold timing adjustment circuit according to claim 12, wherein:

said first gate line is connected at its one end to a first power-supply voltage line supplied with said voltage approximately equal to a high voltage level of binary form and at its other end to a second power-supply voltage line supplied with said voltage approximately equal to a low voltage level of binary form; and said second gate line is connected at is one end to said first power-supply voltage line and at its other end to said second power-supply voltage line.

14. A data-hold timing adjustment circuit according to claim 13, wherein at least one end portion of said first and second gate lines intersects at its different points with said first or second power-supply voltage line and its branch line via an insulator and said gate line is connected to said power-supply voltage line or said branch line via a contact hole formed in said insulator at its intersecting point.

15. A data-hold timing adjustment circuit according to claim 1, wherein said variable capacitors are diodes, said capacitance of which being variable according to an applied reverse voltage.

16. A data-hold timing adjustment circuit according to claim 1, further comprising a semiconductor integrated circuit including a register having said plurality of latch means.

17. A data-hold timing adjustment circuit according to claim 2, further comprising a semiconductor integrated circuit including a register having said plurality of flip-flops.

18. A data-hold timing adjustment circuit according to claim 7, further comprising a semiconductor integrated circuit including a register having said plurality of latch means.

19. A data-hold timing adjustment circuit according to claim 11, further comprising a semiconductor integrated circuit including a register having said plurality of latch means.

* * * * *